(12) United States Patent
Davidovic et al.

(10) Patent No.: US 8,719,746 B1
(45) Date of Patent: May 6, 2014

(54) REDUCTION OF METAL FILL INSERTION TIME IN INTEGRATED CIRCUIT DESIGN PROCESS

(71) Applicant: LSI Corporation, Milpitas, CA (US)

(72) Inventors: Goran Davidovic, Munich (DE); Rupert Kleeberger, Munich (DE); Fulvio Pugliese, Munich (DE); Juergen Inderst, Munich (DE)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/684,880

(22) Filed: Nov. 26, 2012

(51) Int. Cl.
*G06F 9/445* (2006.01)
*G06F 17/50* (2006.01)

(52) U.S. Cl.
USPC ............... 716/112; 716/52; 716/54; 716/135; 716/119

(58) Field of Classification Search
USPC .............. 716/52, 54, 112, 119, 126, 134, 135
See application file for complete search history.

(56) References Cited

U.S. PATENT DOCUMENTS

| | | | |
|---|---|---|---|
| 7,152,215 | B2 | 12/2006 | Smith et al. |
| 7,448,010 | B1 | 11/2008 | Lenahan et al. |
| 7,661,078 | B1 * | 2/2010 | Noice et al. ................... 716/136 |
| 2004/0098393 | A1 * | 5/2004 | Vuong et al. .................. 707/100 |
| 2005/0080607 | A1 * | 4/2005 | Lakshmanan et al. .......... 703/14 |
| 2007/0101305 | A1 * | 5/2007 | Smith et al. ....................... 716/8 |
| 2007/0256039 | A1 * | 11/2007 | White ............................... 716/4 |
| 2009/0031261 | A1 * | 1/2009 | Smith et al. ....................... 716/2 |
| 2010/0229135 | A1 * | 9/2010 | Ylinen et al. ...................... 716/5 |
| 2010/0270671 | A1 * | 10/2010 | Holesovsky et al. .......... 257/734 |
| 2011/0049721 | A1 * | 3/2011 | Koti et al. ..................... 257/773 |
| 2012/0284679 | A1 * | 11/2012 | Tetelbaum .................... 716/113 |

OTHER PUBLICATIONS

P. Gupta et al., "Closing the Loop in Interconnect Analyses and Optimization: CMP Fill, Lithography and Timing," Proceedings of the 22nd International VLSI/ULSI Multilevel Interconnection (VMIC) Conference, Oct. 2005, 12 pages.

* cited by examiner

*Primary Examiner* — Vuthe Siek
*Assistant Examiner* — Brian Ngo
(74) *Attorney, Agent, or Firm* — Ryan, Mason & Lewis, LLP (57) ABSTRACT

Techniques for use in integrated circuit design systems for reducing metal fill insertion time in the integrated circuit design process. In one example, a method includes the following steps. Metal fill data associated with a given layout from a placement and routing database of an integrated circuit design system is stored. The metal fill data is purged from the placement and routing database. At least one change to layout data in the placement and routing database is implemented. The stored metal fill data is loaded into the placement and routing database after the at least one change is implemented to the layout data. A check is performed for an existence of one or more violations associated with the metal fill data due to implementing the at least one change to the layout data in the placement and routing database. A correction procedure is performed on the metal fill data when one or more violations exist.

18 Claims, 7 Drawing Sheets

| BLOCK SIZE | COMPLEXITY IN 4T GATES | NUMBER OF MEMORY INSTANCES | NUMBER OF MEMORY BITS | NUMBER OF METAL FILL RECTANGLES INSERTED | TYPICAL RUN-TIME |
|---|---|---|---|---|---|
| 3.25 mm$^2$ | ~900k | 207 | ~850k | 170k | ~3h |
| 24.80 mm$^2$ | ~2000k | 479 | ~1700k | 1600k | ~16h |
| 32.24 mm$^2$ | ~2000k | 1240 | ~10200k | 3000k | ~24h |

| BLOCK SIZE | COMPLEXITY IN 4T GATES | NUMBER OF MEMORY INSTANCES | METAL FILL INSERTION RUN-TIME | INCREMENTAL METAL FILL FIX RUN-TIME | SPEED-UP FACTOR |
|---|---|---|---|---|---|
| 3.25 mm² | ~900k | 207 | ~3h | 30 sec | 360x |
| 24.80 mm² | ~2000k | 479 | ~16h | 5 min | 200x |
| 32.24 mm² | ~2000k | 1240 | ~24h | 17 min | 84x |

US 8,719,746 B1

REDUCTION OF METAL FILL INSERTION TIME IN INTEGRATED CIRCUIT DESIGN PROCESS

BACKGROUND

A System-on-a-Chip (SoC) is an integrated circuit in which the components needed for a particular system to operate are included on a single semiconductor device. Today's SoC designs continue to grow in complexity and performance as technology processes provide greater and greater densities. With the development of new technologies and increased densities, the integrated circuit fabrication process also becomes more complex. One of the requirements for error-free chip fabrication is that a certain metal density threshold is maintained in all metal layers on the silicon die.

In order to maintain this metal density threshold, one of the final processes in integrated circuit layout design is a metal fill insertion process. In this step of the circuit layout design, a place and route tool looks for areas in any metal layer where the routing is not dense enough (i.e., does not meet the metal density threshold) and fills this area with metal fill (e.g., floating metal rectangles) to achieve the required metal density threshold. After the layout is filled with floating metal rectangles, the metal density is rechecked for compliance with the threshold requirement.

SUMMARY

Embodiments of the invention provide techniques for use in integrated circuit design systems for reducing metal fill insertion time in the integrated circuit design process.

In one embodiment of the invention, a method comprises the following steps. Metal fill data associated with a given layout from a placement and routing database of an integrated circuit design system is stored. The metal fill data is purged from the placement and routing database. At least one change to layout data in the placement and routing database is implemented. The stored metal fill data is loaded into the placement and routing database after the at least one change is implemented to the layout data. A check is performed for an existence of one or more violations associated with the metal fill data due to implementing the at least one change to the layout data in the placement and routing database. A correction procedure is performed on the metal fill data when one or more violations exist.

Alternative embodiments of the invention including, but not limited to, systems, apparatus, integrated circuits and computer-readable storage media, provide other implementations of the metal insertion time reduction functionality described herein in order to improve the integrated circuit design process.

DETAILED DESCRIPTION

Embodiments of the invention will be illustrated herein in conjunction with exemplary integrated circuit design systems. It should be understood, however, that embodiments are more generally applicable to any integrated circuit design systems in which it would be desirable to reduce the time associated with the metal fill insertion process.

Figure 1:
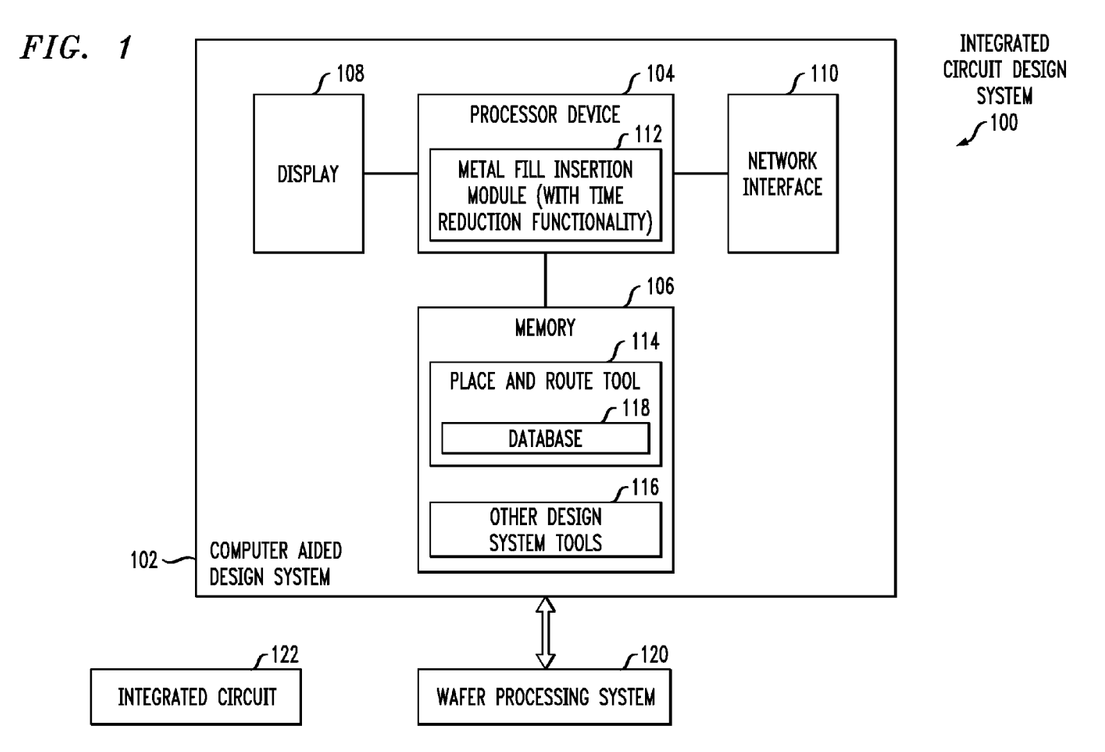
FIG. 1 is a diagram showing an integrated circuit design system with metal fill insertion time reduction functionality according to an embodiment of the invention.

FIG. 1 is a diagram showing an integrated circuit design system with metal fill insertion time reduction functionality according to an embodiment of the invention. As shown, system 100 includes a computer aided design (CAD) system 102. The CAD system 102 includes a processor device 104 coupled to a memory 106, and a display 108. The CAD system 102 also includes a network interface 110, coupled to the processor 104, for permitting the CAD system 102 to communicate with other systems and devices over one or more networks. In one embodiment, network interface 110 comprises one or more transceivers. The processor device 104 implements a metal fill insertion module 112 with time reduction functionality for reducing the metal fill insertion time in an integrated circuit design in a manner disclosed herein. The metal fill insertion module 112 operates in conjunction with a place and route tool (module) 114. The CAD system 102 also includes other design system tools 116. The place and route tool 114 and the other design system tools (modules) 116 are shown in FIG. 1 as being stored in memory 106. However, it is to be understood that parts or all of tools 114 and 116 are loaded and executed by the processor 104 when needed.

The place and route tool 114 generally inputs a netlist for a given circuit design and converts the netlist into a layout, snapshots of which are viewable on display 108 of the CAD system 102. As is known, the netlist is generated from one or more schematic diagrams of the particular integrated circuit design entered by the designer or some other individual via the CAD system 102. The place and route tool 114 performs placement and routing operations for each block of the integrated circuit design. As illustratively used here, a "block" is a designated functional area of the integrated circuit design and/or a designated physical area of the integrated circuit device upon which the design is fabricated. Other definitions of the term block are contemplated in alternative embodiments. The placement operation decides where to place electronic components, circuitry, and/or logic elements of the integrated circuit design on the integrated circuit device. The placement operation is then followed by the routing operation. The routing operation decides where to run the wires needed to connect the placed components, circuitry, and/or elements. The routing operation implements the connections while following predetermined rules and limitations associated with the overall integrated circuit fabrication process. The place and route tool 114 maintains a placement and routing database 118 which stores the layout location data for each placement and routing decision.

The other system design tools 116 include other functions and operations of an integrated circuit design system which are not the focus of embodiments of the invention and thus are not further described herein. For example, other system design tools 116 include, but are not limited to, a circuit simulation tool, a noise analysis tool, etc.

Elements such as 112, 114 and 116 are implemented at least in part in the form of software stored in memory 106 and processed by processor device 104. For example, the memory 106 may store program code that is executed by the processor device 104 to implement the metal fill insertion process with time reduction functionality of module 112 within an overall integrated circuit design process. The memory 106 is an example of what is more generally referred to herein as a computer-readable storage medium or other type of computer program product having computer program code embodied therein, and comprises, for example, electronic memory such as RAM or ROM, magnetic memory, optical memory, or other types of storage devices in any combination. The processor device 104 comprises a microprocessor, a central processing unit (CPU), an application specific integrated circuit (ASIC), a field programmable gate array (FPGA) or other type of processing device, as well as portions or combinations of such devices.

As further shown, the integrated circuit design system 100 in FIG. 1 also includes a wafer processing system 120 operatively coupled to the CAD system 102. In general, the CAD system 102 generates one or more masks, specific to the given integrated circuit design, and provides them to the wafer processing system 120. Using well known techniques, the wafer processing system 120 applies the one or more masks to the silicon die (wafer) during the fabrication of the given integrated circuit. It is to be understood that the integrated circuit design system 100 in FIG. 1 includes other systems, processes, and/or operations, not expressly shown, in alternative embodiments of the invention. A result of the integrated circuit design processes performed by the system 100 is integrated circuit 122 shown in FIG. 1.

The reduced metal fill insertion time functionality of module 112 generally reduces the so-called "turn-around-time" in the final phase of the timing closure process of the integrated circuit design. As will be explained in accordance with embodiments of the invention below, this time reduction is implemented, for example, by incrementally adopting already existing floating metal fill to changes in placement and routing in a given layout.

Before describing embodiments of the invention, some illustrative design scenarios where this metal fill insertion time reduction can be implemented are presented. However, embodiments of the invention can be implemented in many other design scenarios, and thus are not intended to be limited to the ones described below.

Figure 2:
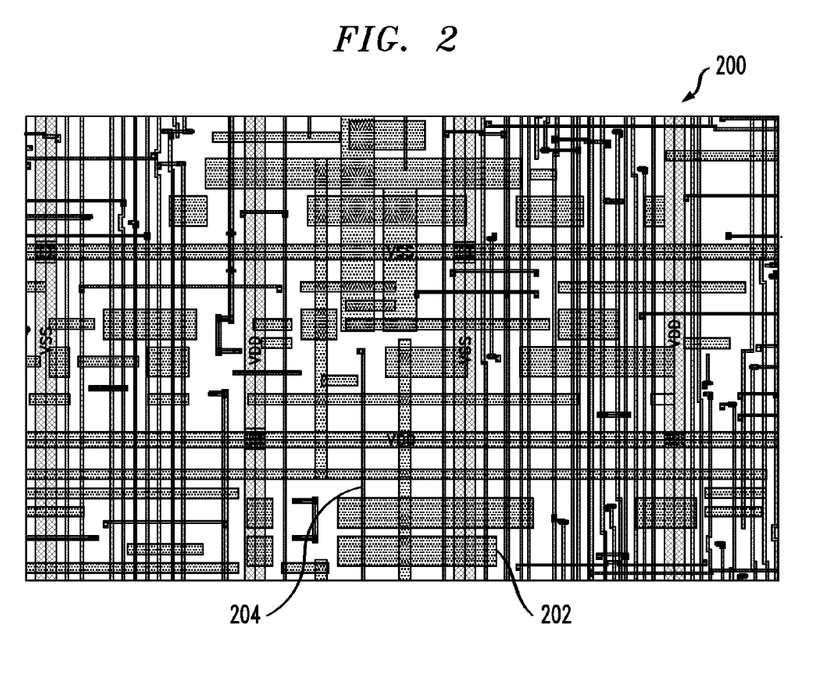
FIG. 2 is a diagram showing a snapshot of an integrated circuit layout with typical routing with inserted metal fill rectangles.

FIG. 2 shows a typical layout 200 with routing and inserted metal fill after a typical metal fill insertion process is completed. The process of inserting additional metal fill rectangles (e.g., metal fill rectangle 202 shown in layout 200) into the routing of the signal paths (e.g., signal path or wire 204 shown in layout 200) introduces additional capacitance which influences the signal timing significantly. Therefore, this process should be done prior to any sign-off design parasitic extraction and timing check.

The process of metal fill insertion is a complex task for any place and route tool, especially with the increasing number and complexity of design rule check (DRC) rules with each new technology. DRC rules are the predetermined rules and limitations associated with the overall integrated circuit fabrication process for a given technology. For example, DRC rules specify the following limitations. The metal fill rectangles should only be of a certain size range, and they should have a certain minimum spacing to the other metal fill rectangles and to the signal routing wires. Also, the spacing and size of the rectangles depends on many different parameters, some of which include metal layer parameters, routing wire width and length parameters, via position and shape parameters, etc. These parameters are specified in the DRC rules.

Figure 3:
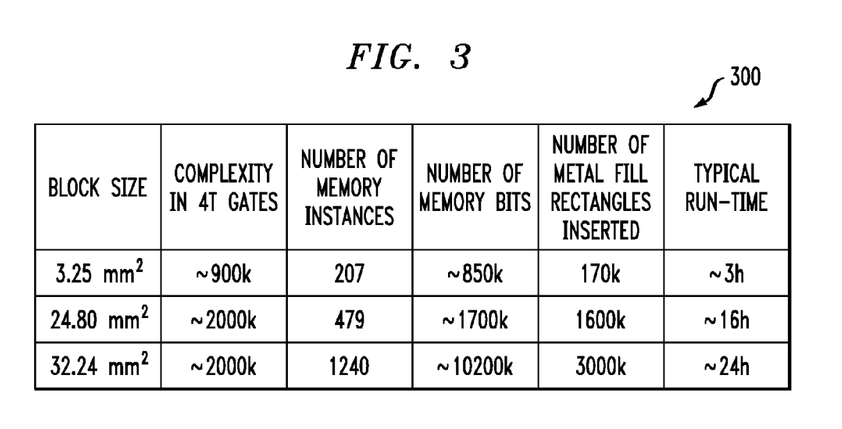
FIG. 3 is a diagram showing typical run-time values associated with metal fill insertion for respective block sizes and complexities.

In order to meet all of these criteria, the place and route tool run-time for metal fill insertion becomes a significant factor in a circuit layout flow. This is especially the case since this step must be repeated every time the routing is changed in order to provide the correct parasitic data before launching any sign-off timing checks. This becomes even more significant in the final design clean-up phase as the scheduled integrated circuit tape-out date approaches. Table 300 in FIG. 3 shows some typical run-time values for the metal fill insertion depending on the given block size and complexity.

As illustrated in table 300, the place and route run-time increases rapidly with an increase in the block size and/or complexity of the design, e.g., see last column of table 300 with increasing run-times (in hours) for increasing block size (first column) and/or complexity (second through fifth columns) of the designs in each row.

In the final phase of the layout design, integrated circuit designers are investing a significant effort in cleaning up the placement and routing database (118 in FIG. 1) by eliminating the timing and DRC violations. Such clean-up is usually accomplished by applying engineering change order (ECO) changes, which are basically incremental fixes in placement and routing in the layout. For each of these changes, the designers go through the entire loop of metal fill insertions and execute a new parasitic extraction process. This rapidly increases the turn-around-time to get the correct timing results and other analysis results after each ECO loop. And usually, there are many ECO loops needed to clean up all of the violations and to be ready to finally send the integrated circuit to fabrication.

Therefore, reducing the metal fill insertion run-time, especially for complex designs, has a major impact on the overall ECO turn-around-time which is a critical factor in an integrated circuit design schedule.

Figure 5A:
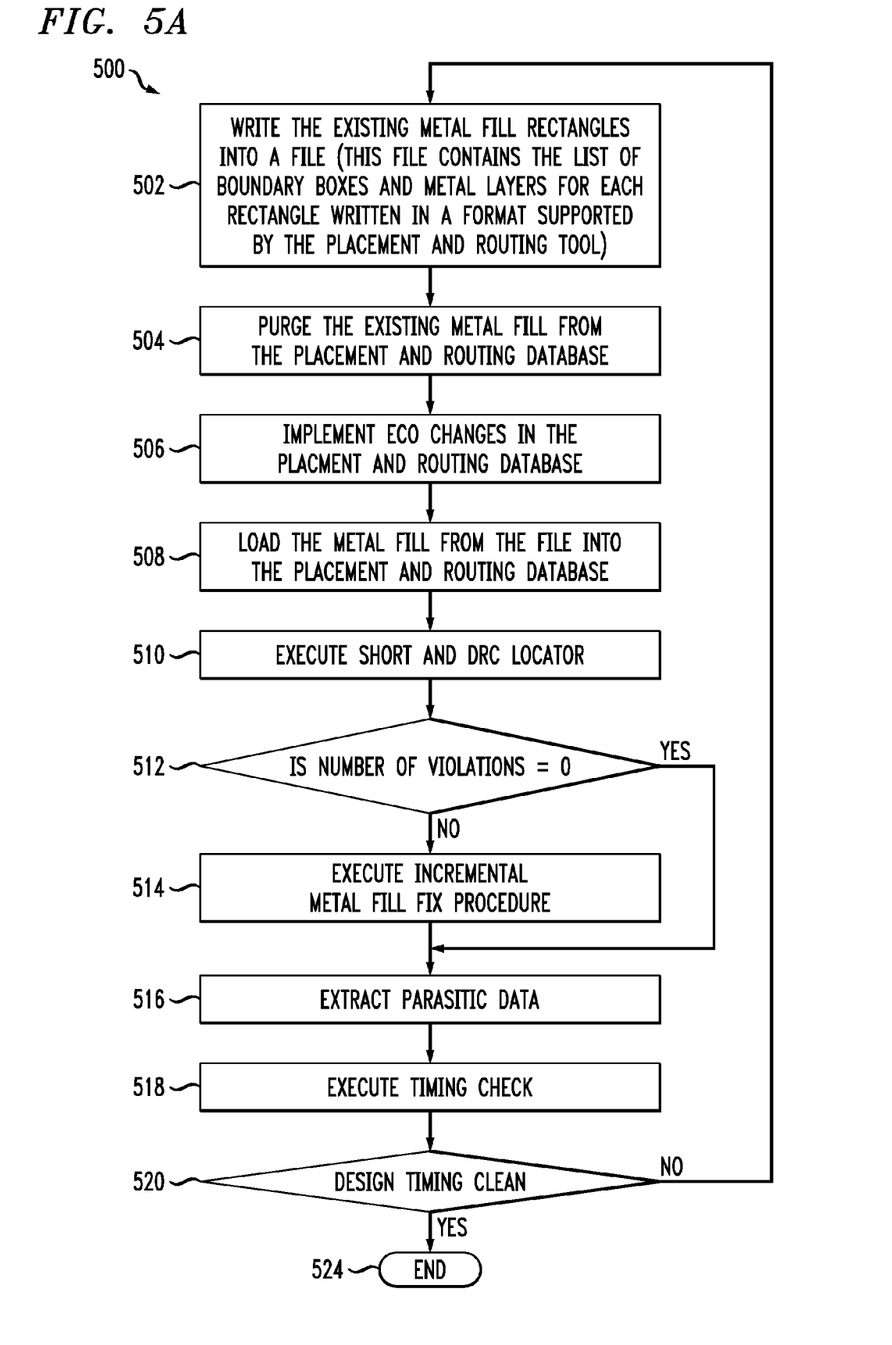
FIG. 5A is a diagram showing a metal fill insertion methodology implementing reduced metal fill insertion time functionality according to an embodiment of the invention.
Figure 5B:
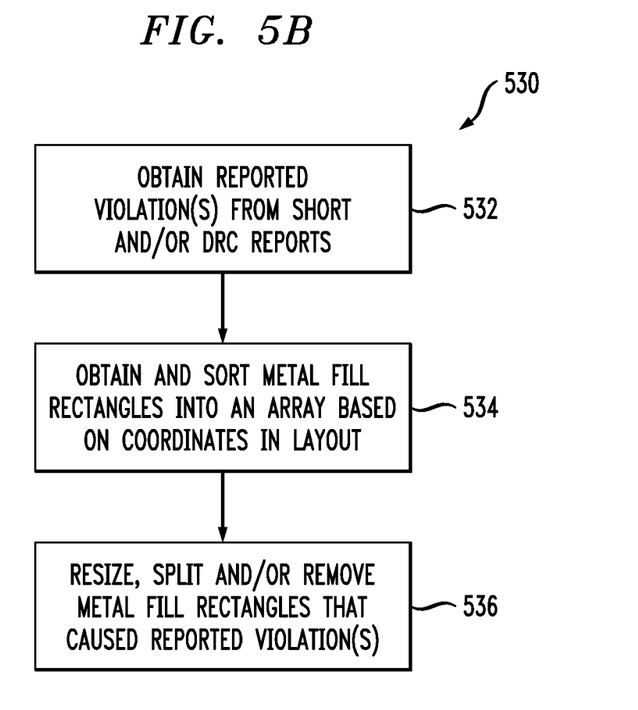
FIG. 5B is a diagram showing an incremental metal fill fix procedure according to an embodiment of the invention.

In order to implement ECO changes, the existing metal fill data (e.g., layout location and parameters of metal fill rectangles as will be further explained below in the context of FIGS. 5A and 5B) is first written into a file, purged from the placement and routing database, and loaded from the file again after the ECO changes are implemented in the placement and routing database. The reason for purging the fill prior to the ECO changes is to allow the place and route tool to choose the best possible routing for the ECO changed signal wires. If the metal fill were present, the tool would not be able to route optimally because the integrated circuit area could be completely filled either with signal routing or with metal fill to achieve the requested metal density threshold. The process of writing metal fill into a file and purging it is usually relatively fast, e.g., it takes no more than a few minutes even for very complex blocks.

Figure 4:
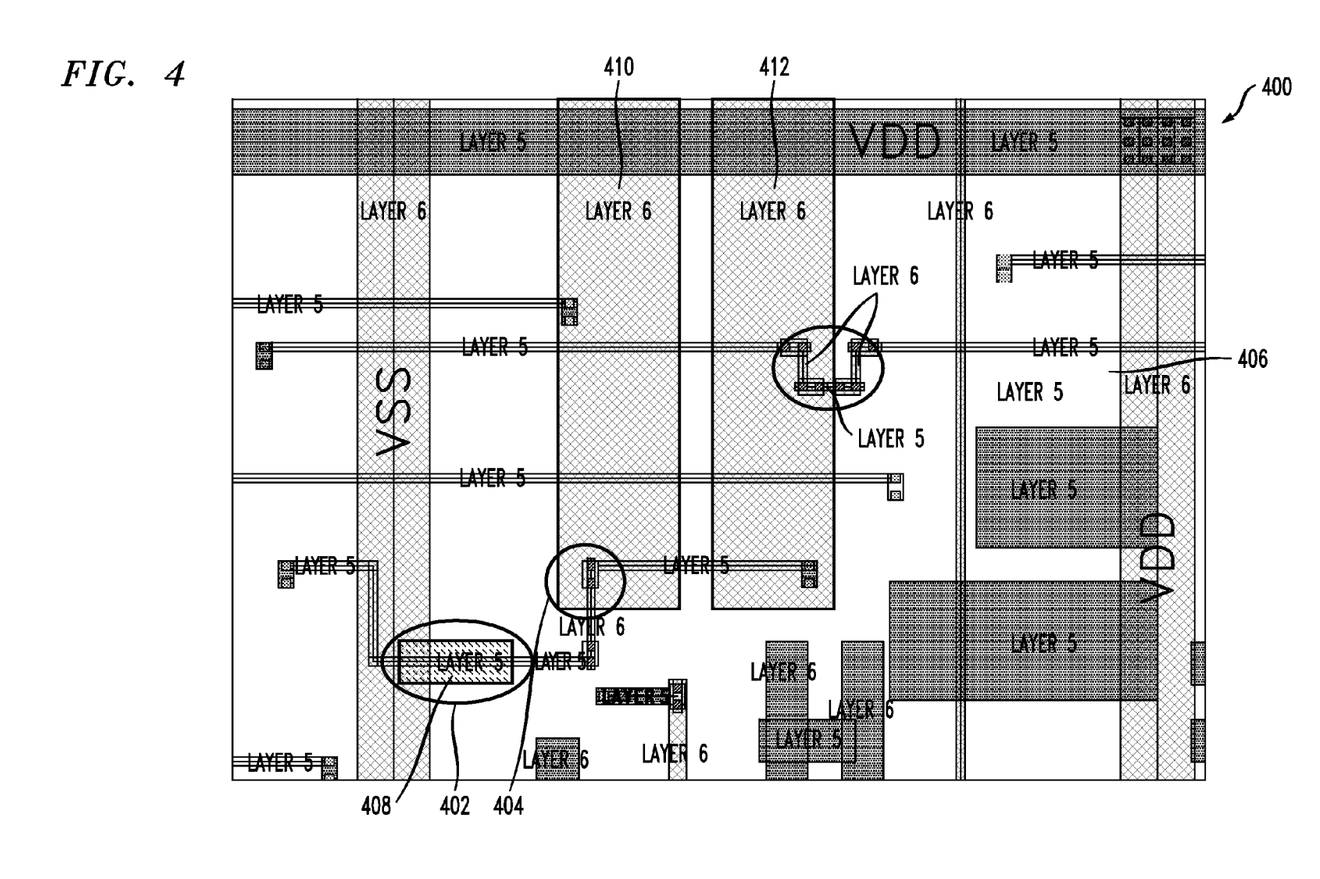
FIG. 4 is a diagram showing a snapshot of an integrated circuit layout depicting shorts between signal routing and metal fill rectangles.

After the existing metal fill is loaded into the database 118 again, there will typically be overlaps and spacing violations between signal routing and the metal fill rectangles due to the fact that the fill is not adjusted to the ECO changes already being done. FIG. 4 shows an example layout 400 after ECO changes are implemented with the circled areas 402, 404, and 406 where the shorts between signal wire(s) and the metal fill are located, and referenced metal fill rectangles 408, 410, and 412 that cause the shorts. Note that layout 400 depicts multiple metal layers, i.e., layer 5 and layer 6 (as labeled in FIG. 4). Shorts can exist between polygons (metal fill rectangles), wires and/or vias in the same layer. For the snapshot presented on FIG. 4, the short labeled 406 shows such case where the short is only in layer 6 but with a via and with a wire. However, at places where the routing changes layers, and thus there is a via connecting both layers, there can be a short between layers. Typically, the shorting in layout 400 happens for the ECO changes in the areas where signal routing is not so dense and inserted metal fill is therefore present. When the place and route tool tries to use an empty area for a new routing, this causes the shorts or DRC violations when the existing fill is loaded again.

A usual flow for implementing these kinds of ECO changes avoiding the shorts and DRC violations with metal fill would be to purge the fill, make the ECO change, and run the fill insertion process again. As explained above, for a complex designs, this can be a very long process causing a significant delay in the overall design execution (e.g., see run-times in table 300 FIG. 3).

Embodiments of the invention use a different approach in order to improve the run-time for such ECO changes. This approach is shown in methodology 500 of FIG. 5A. It is to be understood that the methodology 500 is performed via metal fill insertion module 112 in FIG. 1 in conjunction with the place and route tool 114 and the placement and routing database 118.

In step 502, the data associated with the existing metal fill rectangles is written from the placement and routing database 118 into a storage file. As mentioned above, for example, this storage file contains the list of boundary boxes and metal layers for each rectangle and is written in a format supported by the place and route tool.

In step 504, the existing metal fill data is purged from the placement and routing database 118.

In step 506, the ECO changes are implemented on the layout data in the placement and routing database 118.

In step 508, the metal fill data is loaded from the storage file back into the placement and routing database 118.

In step 510, a short locator and a DRC violation locator are executed on the database 118 to analyze and identify the violation locations and layers. Short and DRC violation analyses are a normal part of a place and route tool. That is, place and route tool 114 is configured to identify and locate these kinds of violations in the routed database 118. In one embodiment, the Synopsys IC Compiler® tool (Synopsys, Inc. of Mountain View, Calif.) is used for performing all or part of step 510, wherein the command for locating shorts is:

verify_lvs-check_short_locator

In case of FIG. 4, the Synopsys IC Compiler® tool produces a short report which is shown below:

Short at [(22.895,705.125),(23.835,705.195)] in metal5.
NULL (0).
N36720 (4448004).
Short at [(24.130,707.370),(24.610,707.825)] in metal6.
NULL (0).
n4282 (16180752).

Label NULL (0) in the short report example above represents a so-called 'null-net' which basically means floating fill, e.g., floating metal rectangles (not connected to any net, for example, ground net, which would then be grounded fill). When the fill is grounded (or connected to any other net), any resize or split of a metal fill rectangle takes into account the connection of the changed rectangle(s) to the ground net (or any other connected net).

The same kind of report can be obtained for the DRC violations using an appropriate built-in tool or an external tool. The main information needed is the violation location given with the boundary-box coordinates and the metal layer as shown above for the short locator report. Thus, it is to be understood that embodiments of the invention are not limited to this particular tool and format of the report, but are more generally applicable to any suitable tool able to locate violations between signal routing and metal fill polygon areas represented by two-dimensional coordinates and, in a third dimension, by metal layer.

Step 512 checks whether there are no violations detected in step 510. If yes (i.e., violations=0), then the methodology 500 proceeds to parasitic data extraction (step 516) and timing check execution (step 518) on the placement and routing database 118.

If, however, there are one or more violations detected in step 510, then the methodology 500 executes an incremental metal fix (correction) procedure 514. FIG. 5B shows details of procedure 514 according to an embodiment of the invention. That is, the methodology 530 in FIG. 5B reads in all reported violations boundary box locations and metal layers from the short and/or DRC reports, in step 532. In step 534, the methodology reads in and sorts all of the metal fill rectangles. The metal fill rectangles are represented as an area-based array (i.e., based on layout coordinates), as will be explained further below. The array of metal fill rectangles is sorted to provide easy and fast access to members of the array that have overlaps with the areas reported as violated. In step 536, after the rectangles responsible for the violations are identified, the methodology incrementally starts resizing and splitting the rectangles to smaller sized rectangles to avoid each violation. If the resulting rectangle size is so small that it violates a given minimum size parameter, the rectangle is removed.

The procedure 514 (methodology 530) is performed until all reported boundary box coordinates are considered and analyzed, and no more violations are present between the signal routing and the existing metal fill rectangles. The placement and routing database 118 is then ready for parasitic extraction (step 516) and timing check execution (step 518).

Step 520 checks that the overall timing of the given integrated circuit design is clean (e.g., acceptable to the designer). If yes, the methodology 500 ends at step 524. If not, then methodology 500 is performed again. Note that, as a result, a new storage file is created and saved after each iteration.

In one embodiment of the invention, all or parts of methodology 500 are written in Tcl (tool command language) programming language. A main reason for this particular language is that the place and route tool used in one embodiment is Tcl-based, i.e., it contains a built-in Tcl interpreter which can execute Tcl-based procedures directly. Again, it is to be understood that any such embodiment does not limit the generality of the solution, and that all or parts of methodology 500 can be written in any language and it can be applied inside or outside of the place and route tool itself.

Figure 6:
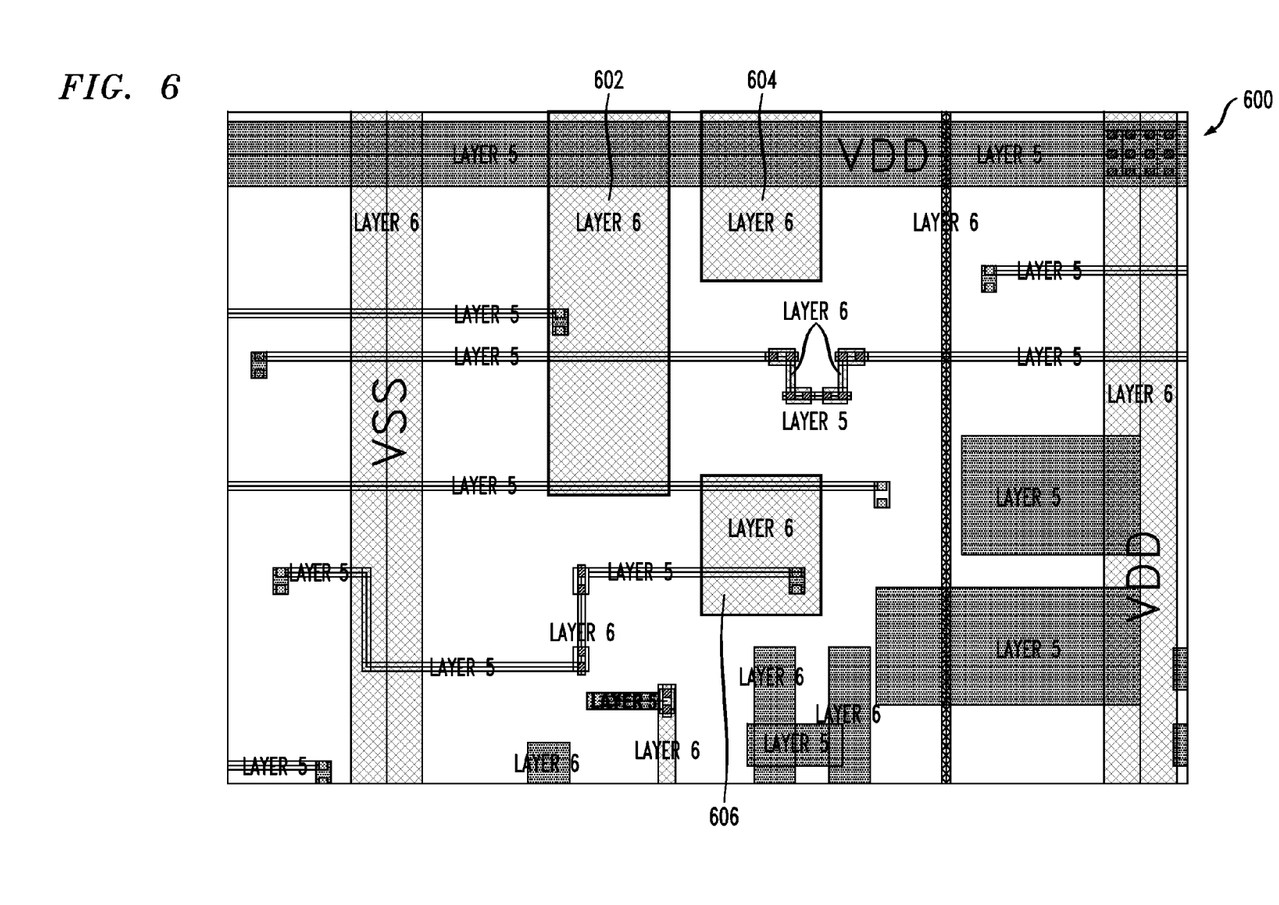
FIG. 6 is a diagram showing a snapshot of an integrated circuit layout depicting corrected shorts between signal routing and metal fill rectangles in accordance with a metal fill insertion time reduction embodiment of the invention.

In the particular case shown in FIG. 4, the resulting layout 600 after implementing the incremental metal fill fix procedure (514) of methodology 500 is shown in FIG. 6. Thus, as shown in layout 600 of FIG. 6 in comparison with layout 400 of FIG. 4, metal fill rectangle 410 has been resized in the vertical direction to avoid short 404 and is thus shown in layout 600 as metal fill rectangle 602. Metal fill rectangle 412 in layout 400 has been split into two smaller rectangles, shown as metal fill rectangles 604 and 606 in layout 600, to avoid short 406. Lastly, metal fill rectangle 408 in layout 400 has been completely removed in layout 600 to avoid short 402. It can be assumed that the resizing or splitting of metal fill rectangle 408 was not possible because it would create a rectangle so small that it would violate certain minimum area rules which exist for metal fill rectangles in this technology. The resulting layout 600 is thus short-free (with regard to the shorts as depicted in layout 400 of FIG. 4) with a minimum loss of metal density, and minimal and only local changes in the placement and routing database 118. The incremental metal fill fix procedure used to generate corrected layout 600 took about 30 seconds of a run-time, while the metal fill insertion run-time for this particular block takes about 3 hours.

Note that metal fill rectangles that are read in by the procedure are first sorted in an area-based array. In this way, the procedure is able to quickly identify all possible candidate polygons which are shorted at reported coordinates without searching through the entire list of polygons. As can be seen from table 300 in FIG. 3, fifth column, the number of polygons in the typical design can be very high, up to several million. To search through this large amount of data, looking for polygons which are shorted with the routing shapes at certain coordinates and layers, really means a process of comparison of polygon coordinates with the reported short coordinates, for each polygon and for each short. If the number of shorts is in the range of 100-1000 or similar, the number of comparisons might easily rise above a billion. That certainly requires a long processing time which in certain cases can be comparable with the full run-time for metal fill insertion represented in the sixth column of table 300. To avoid such a long search run-time, in embodiments of the invention provided herein, the polygons are first sorted in a 2-dimensional array based on their coordinates. Instead of searching through the entire list of fill polygons, the procedure searches only the part of the database containing the polygons with coordinates comparable to the reported short coordinates, thus reducing the run-time for that step by a huge factor.

Figure 7:
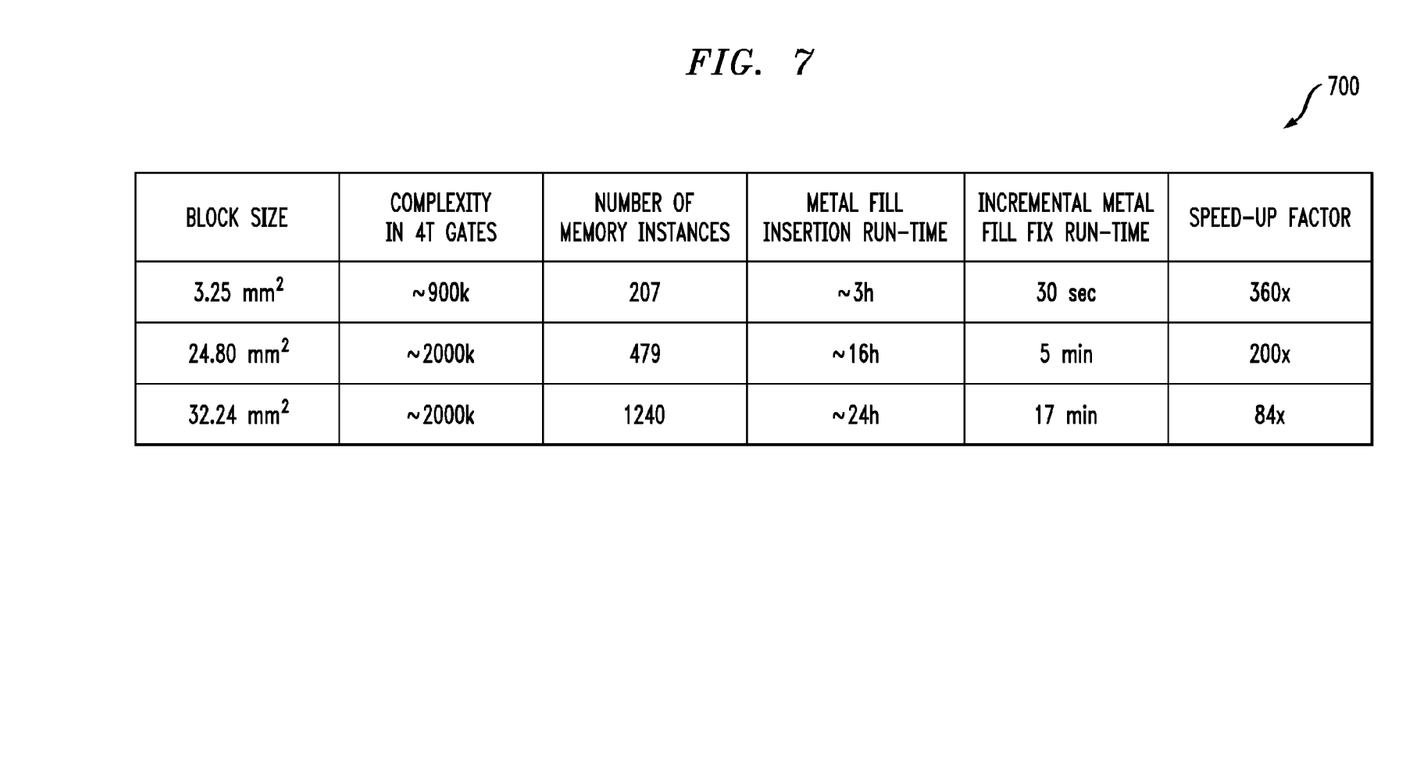
FIG. 7 is a diagram showing run-time value comparisons between typical metal fill insertion and a metal fill insertion methodology implementing reduced metal fill insertion time functionality according to an embodiment of the invention.

This can even be simply controlled by the granularity of the area-based array used to sort the polygons. If we sort the polygons with more granularity, meaning less design area assigned to a single array element, the search will be faster since there will be less polygons to compare at each reported short location. Moreover, this approach makes the incremental metal fill fix procedure substantially independent of the number of violations which leads to a large run-time improvement as presented in table 700 of FIG. 7, in particular, see the sixth column of table 700.

According to these results, the required time for the process of ECO changes is significantly improved. An illustrative flow according to one embodiment is as follows:

(1) execute the metal fill insertion once at the beginning of the ECO loops phase;

(2) use the incremental metal fill fix procedure in each ECO loop thus saving significant run-time; and (3) repeat the metal fill insertion process again after a given number of ECO loops if the number of violations is higher than a given maximum number.

A main reason for the third step above is that each incremental fix results in a reduction of the area covered by the metal fill rectangles by a small factor (i.e., due to size reduction and removal of a certain number of metal fill rectangles). If the metal density is sufficiently above the metal density threshold in a particular area where the violation is located (which is a more probable case because the probability of the violation is higher where more metal fill rectangles are present), then the resulting fix is usually so small that the metal density threshold requirement would not be violated and the database 118 would still maintain an acceptable sign-off quality.

However, after many ECO loops with the same metal fill insertion performed once at the beginning, the number of violations would increase so much, that it can cause the metal density threshold requirement to be violated in certain areas with too many incremental changes done. In that case, it is recommended to reserve the time in the schedule, run the full metal fill insertion once again, and start the ECO loops process again with the newly updated metal fill as the starting point. The acceptable number of ECO loops to perform before applying the full metal fill insertion process again is decided on a case-by-case basis. One can even ignore this effect until the end of ECO phase when everything is cleaned up, and then run the metal fill insertion process again. This can cause a small number of additional timing and DRC violations that need to be fixed with additional ECO loops at the end. Another criterion to consider as to when to run a new full metal fill insertion process is the metal density report. As long as the metal density threshold requirement is not violated, no new metal fill insertion is needed and the fast, time-saving incremental metal fill fix procedure can be continued without any loss in accuracy.

Accordingly, as described herein, embodiments of the invention reduce metal fill insertion run-time especially in the final phase of the integrated circuit layout design during which many ECO changes are performed. Reducing the run-time of each single ECO loop, without any major impact on the accuracy of the results, significantly relaxes the integrated circuit fabrication schedule and minimizes engineering idle time usually spent in waiting for the results of the applied ECO changes.

To these ends, an embodiment of the invention includes a method for reducing the run-time for the metal fill insertion process without major accuracy loss in the final timing analysis results. The method is based on the incremental fix of the existing metal fill instead of purging the fill and running the whole process from the beginning. The method begins with identifying the boundary box locations where the metal shorts or DRC violations (e.g., such as minimum distance violation) are present between the existing metal fill and the new changes in the routing. Each of these locations is analyzed and metal fill rectangles are identified which cause the violation with signal routing. Each identified rectangle is then resized or split into smaller ones in order to avoid the particular violation. If the resizing and splitting is not possible due to some minimum size or minimum distance criteria being violated, the rectangle is simply removed. After the process is completed, no shorts and no DRC violations are expected between the signal routing and metal fill rectangles.

Another embodiment of the invention includes a computer-readable storage medium, the contents of which cause a computer system to perform an incremental metal fill fixing process. The process begins with identifying metal fill rectangles that have shorts or DRC violations with signal routing. Then, the identified rectangles are resized, split or removed to fix the shorts locally.

In another embodiment of the invention, a system provides an incremental rectangle fix process. The system is made up of a processing system storing a metal fill rectangle fix program and a storage unit having a database containing integrated circuit placement and routing information accessible by the metal fill rectangle fix program. The system also provides for identifying metal fill rectangles in the database that have violations with the signal routing. The system also provides for executing the metal fill rectangle fix program, whereby the identified metal rectangles are resized or split to reduced lengths and then selectively removed if the certain minimum length criteria are violated.

Although embodiments of the invention have been described herein with reference to the accompanying drawings, it is to be understood that embodiments of the invention are not limited to the described embodiments, and that various changes and modifications may be made by one skilled in the art resulting in other embodiments of the invention within the scope of the following claims.

What is claimed is:

1. A method comprising:
   storing metal fill data, associated with a given layout, from a placement and routing database of an integrated circuit design system;
   purging the metal fill data from the placement and routing database;
   implementing at least one change to layout data in the placement and routing database;
   loading the stored metal fill data into the placement and routing database after the at least one change is implemented to the layout data;
   checking for an existence of one or more violations associated with the metal fill data due to implementing the at least one change to the layout data in the placement and routing database; and
   performing a correction procedure on the metal fill data when one or more violations exist, wherein the correction procedure comprises sorting the metal fill data into an array based on coordinates in the given layout such that a need for a correction is determined based on a correspondence between the coordinates of the metal fill data and coordinates of the one or more violations;
   wherein one or more of the above steps are performed via a processing device.

2. The method of claim 1, wherein the correction procedure comprises resizing one or more portions of the metal fill data to overcome at least one of the one or more violations.

3. The method of claim 1, wherein the correction procedure comprises splitting one or more portions of the metal fill data to overcome at least one of the one or more violations.

4. The method of claim 1, wherein the correction procedure comprises removing one or more portions of the metal fill data to overcome at least one of the one or more violations.

5. The method of claim 1, wherein the one or more violations comprise a metal short associated with the metal fill data.

6. The method of claim 1, wherein the one or more violations comprise a design rule check violation associated with the metal fill data.

7. The method of claim 1, wherein checking for one or more violations comprises identifying boundary box locations associated with the metal fill data where at least one metal short or at least one design rule check violation exists due to implementation of the at least one change.

8. The method of claim 1, wherein the at least one change comprises at least one engineering change order.

9. The method of claim 1, further comprising performing the storing, purging, implementing, loading, checking, and correction procedure performing steps with respect to one or more other changes of a plurality of changes.

10. The method of claim 1, further comprising performing parasitic data extraction on the placement and routing database when the one or more violations are removed.

11. The method of claim 1, further comprising executing a timing check on the placement and routing database when the one or more violations are removed.

12. A computer program product comprising non-transitory computer-readable storage medium having computer program code embodied therein for use in designing an integrated circuit, wherein the computer program code when executed in an integrated circuit design system causes the integrated circuit design system to perform the steps of claim 1.

13. An integrated circuit designed in accordance with the steps of claim 1.

14. An apparatus comprising:
    a memory; and
    a processing device operatively coupled to the memory and configured to:
       store metal fill data, associated with a given layout, from a placement and routing database of an integrated circuit design system;
       purge the metal fill data from the placement and routing database;
       implement at least one change to layout data in the placement and routing database;
       load the stored metal fill data into the placement and routing database after the at least one change is implemented to the layout data;
       check for an existence of one or more violations associated with the metal fill data due to implementing the at least one change to the layout data in the placement and routing database; and
       perform a correction procedure on the metal fill data when one or more violations exist, wherein the correction procedure comprises sorting the metal fill data into an array based on coordinates in the given layout such that a need for a correction is determined based on a correspondence between the coordinates of the metal fill data and coordinates of the one or more violations.

15. The apparatus of claim 14, wherein the correction procedure comprises resizing one or more portions of the metal fill data to overcome at least one of the one or more violations.

16. The apparatus of claim 14, wherein the correction procedure comprises splitting one or more portions of the metal fill data to overcome at least one of the one or more violations.

17. The apparatus of claim 14, wherein the correction procedure comprises removing one or more portions of the metal fill data to overcome at least one of the one or more violations.

18. An integrated circuit design system comprising:
    a place and route module; and
    a metal fill insertion module operatively coupled to the place and route module, the metal fill insertion module configured to:
       store metal fill data, associated with a given layout, from a placement and routing database of the place and route module;
       purge the metal fill data from the placement and routing database;
       implement at least one change to layout data in the placement and routing database;
       load the stored metal fill data into the placement and routing database after the at least one change is implemented to the layout data;
       check for an existence of one or more violations associated with the metal fill data due to implementing the at least one change to the layout data in the placement and routing database; and perform a correction procedure on the metal fill data when one or more violations exist, wherein the correction procedure comprises sorting the metal fill data into an array based on coordinates in the given layout such that a need for a correction is determined based on a correspondence between the coordinates of the metal fill data and coordinates of the one or more violations.

\* \* \* \* \*